(12) United States Patent
Menke

(10) Patent No.: US 6,265,862 B1
(45) Date of Patent: Jul. 24, 2001

(54) PROCESS FOR STANDARDISING THE INTENSITY OF OPTICAL SENSORS USED FOR MEASURING PERIODICALLY OSCILLATING ELECTRIC OR MAGNETIC FIELD INTENSITIES

(75) Inventor: Peter Menke, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/214,640
(22) PCT Filed: Jun. 25, 1997
(86) PCT No.: PCT/DE97/01319
  § 371 Date: Jan. 8, 1999
  § 102(e) Date: Jan. 8, 1999
(87) PCT Pub. No.: WO98/01763
  PCT Pub. Date: Jan. 15, 1998

(30) Foreign Application Priority Data

Jul. 9, 1996 (DE) .............................................. 196 27 633

(51) Int. Cl.$^7$ .................................................. G01R 31/00
(52) U.S. Cl. ........................................ 324/96; 324/117 R
(58) Field of Search .................................. 324/96, 117 R, 324/244, 244.1; 250/227.17; 356/345, 351

(56) References Cited

U.S. PATENT DOCUMENTS

| | | |
|---|---|---|
| 4,563,639 * | 1/1986 | Langeac ................................... 324/96 |
| 4,564,754 | 1/1986 | Sato et al. . |
| 4,894,608 | 1/1990 | Ulmer, Jr. . |
| 4,947,107 | 8/1990 | Doerfler et al. . |
| 4,973,899 * | 11/1990 | Jones et al. ............................. 324/96 |
| 5,382,901 | 1/1995 | Okajima et al. . |
| 5,656,934 * | 8/1997 | Bosselmann ........................... 324/96 |
| 5,811,964 * | 9/1998 | Bosselmann et al. ................. 324/96 |
| 5,933,000 * | 8/1999 | Bosselmann et al. ................. 324/96 |

FOREIGN PATENT DOCUMENTS 44 32 146 A1  3/1996 (DE) .

OTHER PUBLICATIONS

P. Menke et al., "Temperature Compensation in Magnetooptic AC Current Sensors Using an Intelligent AC–DC Signal Evaluation", Journal of Lightwave Technology, vol. 13, No. 7, Jul. 1995, pp. 1362–1370.

\* cited by examiner

Primary Examiner—Ernest Karlsen
Assistant Examiner—Minh Tang
(74) Attorney, Agent, or Firm—Schiff Hardin & Waite

(57) ABSTRACT

The inventive method employs the −/+ division for intensity norming but forms the quotient from the signal difference and the signal sum not from component signals (L1, L2) generated by the sensor but—inventively —with signals (L1', L2') derived therefrom that exhibit periodically fluctuating intensity parts (I1'AC, I2'AC) of the same amplitude amount (|A|). The invention largely unites the advantages of −/+ division with those of AC/DC division.

16 Claims, 4 Drawing Sheets

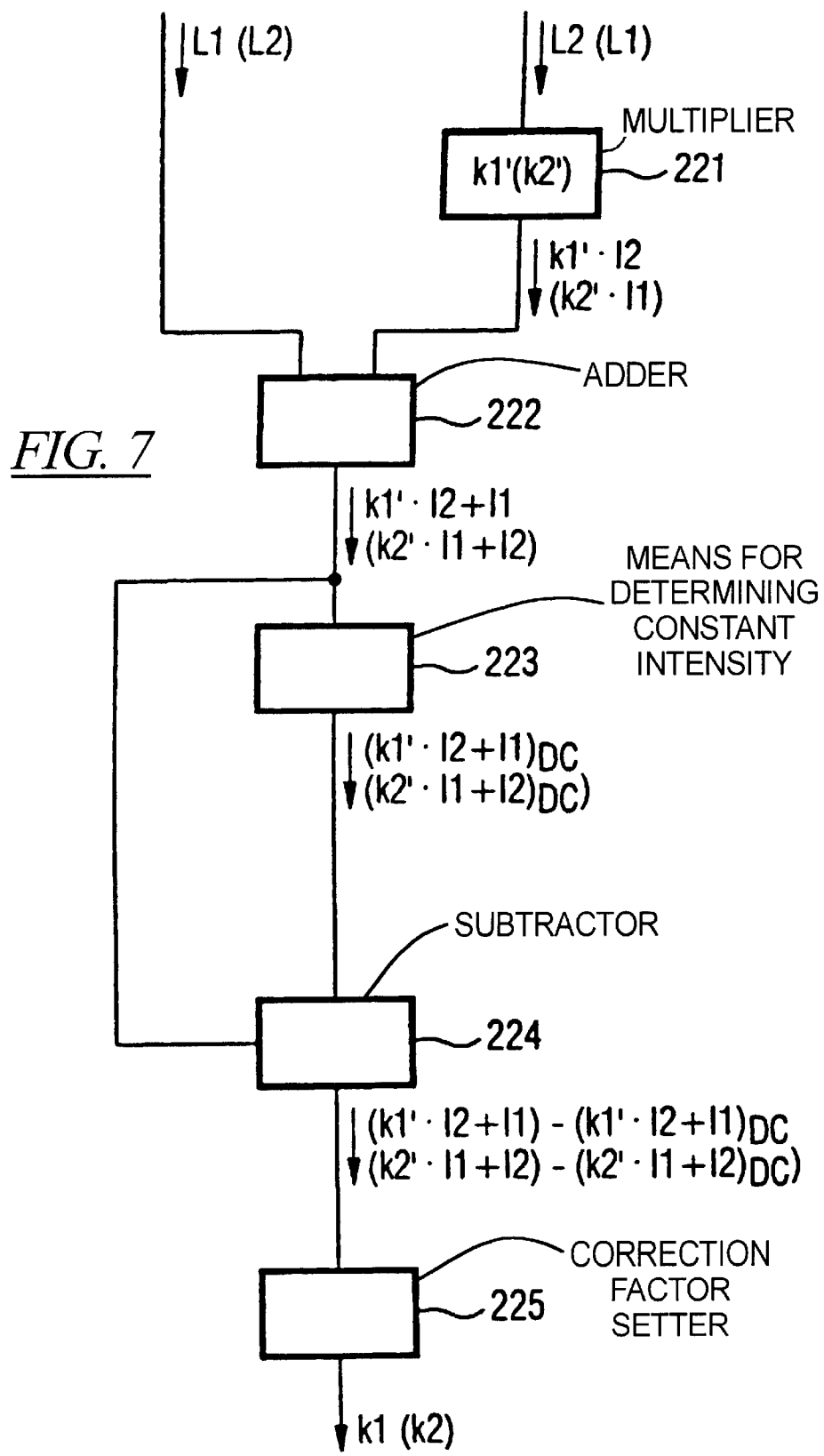

PROCESS FOR STANDARDISING THE INTENSITY OF OPTICAL SENSORS USED FOR MEASURING PERIODICALLY OSCILLATING ELECTRIC OR MAGNETIC FIELD INTENSITIES

BACKGROUND OF THE INVENTION

1. Field of the Invention

The present invention is directed to a method for intensity norming of an optical sensor for measuring a periodically fluctuating electrical and/or magnetic field strength.

2. Description of the Related Art

A known example of an optical sensor for measuring electrical and magnetic fields is a two-channel, polarimetric optical alternating current and/or alternating voltage sensor. Such sensors proceed, for example, U.S. Pat. No. 4,564,754, German Patent Document DE-A-4 432 146 and U.S. Pat. No. 4,894,608.

Such a sensor utilizes the fact that, when polarized light is sent through an electrical and/or magnetic field, a modification of the polarization condition of the light which is dependent on the field strength of this field is produced due to specific physical effects (for example, Faraday effect, Pockels effect) and can be measured.

Alternating current and alternating voltage generate an electrical and/or magnetic field of periodically fluctuating field strength in their environment that generates a periodic fluctuation of the polarization condition of the polarized light sent through this field.

"Two-channel" in the known sensor means that the polarized light sent through the field is supplied to a polarization beam splitter that divides the supplied light into two light components of respectively fixed polarization conditions that, however, are different from one another, for example orthogonal relative to one another, whose intensities are dependent on the polarization condition of the light sent through the field and supplied to the divider.

Every light component generated in this way thus forms an intensity signal whose intensity is dependent on the field strength of the field. What is to be understood here as intensity signal is not only the light component itself but any other generated signal whose intensity, like the intensity of a light component varies dependent on the field strength of the field to be measured. An example is the electrical intensity signal generated by an opto-electrical transducer, for example a diode, from a light component.

Apart from attenuation losses, the intensities of the two light components that have arisen or of the intensity signals add up to the intensity of the light sent through the field and supplied to the polarization beam splitter. When the intensity of this supplied light is constant, the sum of the intensities of the two light components or intensity signals is also constant.

In order to eliminate influences of a non-constant intensity of the light sent through the field and supplied to the polarization beam splitter, an intensity norming is usually implemented.

A standard method for intensity norming of an optical sensor for measuring electrical and magnetic fields is the minus/plus division, i.e. a quantity is formed from the two light components or intensity signals that corresponds to a difference between the intensities of the two light components divided by the sum of the intensities of the two light components (see, for example, U.S. Pat. No. 4,564,754).

The minus/plus division is in the position to also compensate an intensity of the light sent through the field and supplied to the polarization beam splitter that fluctuates very rapidly.

Due to the periodically fluctuating polarization condition of the light sent through the field and supplied to the polarization beam splitter that is conditioned by the field strength, the intensities of the two light components or of both intensity signals generated by the splitter respectively exhibit a corresponding, periodic fluctuation, i.e. they are composed of a constant intensity part this is and of an intensity part periodically fluctuating dependent on the measured field strength.

The periodically fluctuating intensity parts of the intensities of the two light components generated by the splitter or of both intensity signals are in anti-phase relative to one another and, in the ideal case, exhibit an amplitude of the same amount, this resulting therein that the sum of the periodically fluctuating intensity parts of both light components or intensity signals is also constant in addition to the sum of the constant intensity parts when the intensity of the light sent through the field and supplied to the polarization beam splitter is constant.

In the real case, however, the sum of the intensities of the two light components generated by the splitter or of the two intensity signals is often not constant but fluctuates periodically even given a constant intensity of the light sent through the field and supplied to the polarization beam splitter.

This occurs, for example, when the intensity parts of the intensities of thetwo light components generated by the polarization beam splitter or of the two intensity signals that fluctuate periodically in anti-phase relative to one another exhibit amplitudes of an amount differing from one another.

This, for example, can be based thereon that a light conductor conducting the one generated light component from the polarization beam splitter to, for example, an opto-electrical transducer for conversion of the intensity of this light component into a corresponding electrical intensity signal, for example an optical fiber, exhibits a different attenuation than a light conductor conducting the other generated light component to an opto-electrical transducer for conversion of the intensity of this other light component into a corresponding electrical intensity signal.

A standard method for intensity norming of an optical sensor for measuring electrical and magnetic fields that is different from the minus/plus division that is known as AC/DC division (see, for example, U.S. Pat. No. 4,894,608) can compensate light components generated by the polarization beam splitter and containing such intensity parts with amplitudes of a different amount which are periodically fluctuating relative to one another in anti-phase or, respectively, corresponding intensity signals. This method, however, fails given rapid fluctuations of the intensity of the light sent through the field.

SUMMARY OF THE INVENTION

The present invention is based on the object of offering a method for intensity norming of an optical sensor referenced in greater detail above that can compensate both rapid fluctuations of the intensity of the light sent through the field as well as intensity parts which are periodically fluctuating in anti-phase with amplitudes of a different amount in the light components or intensity signals generated by the light sent through the field.

This and other objects of the invention are achieved by a method for intensity norming of an optical sensor for measuring an electrical and/or magnetic field with a periodically fluctuating field strength, given a sensor in which light is sent through the field; two intensity signals separated from one another comprising intensities containing intensity parts fluctuating periodically in anti-phase relative to one another dependent on the periodically fluctuating field strength are generated from this transmitted light and, for intensity norming, a quantity that corresponds to a quotient of a difference formed with the intensities of the two intensity signals and a sum formed with these intensities is derived from the two intensity signals, in that from the two intensity signals, two signals are acquired with signal intensities corresponding to intensities of the two intensity signals, whereby the signal intensities contain signal intensity parts which are periodically fluctuating in anti-phase relative to one another corresponding to the periodically fluctuating intensity parts of the intensities of the intensity signals such that the periodically fluctuating signal intensity parts of both acquired signals exhibit amplitudes of the essentially same amount; and the sum of the signal intensities of the two acquired signals is essentially constant; and in that the quantity is determined by the quotients from a difference of the signal intensities of the two acquired intensity signals and the sum of these signal intensities.

It is advantageously irrelevant in the inventive method whether the intensity parts of the two generated light components or intensity signals fluctuating periodically relative to one another in anti-phase exhibit amplitudes of the same or of a different amount, since correspondingly fluctuating signals whose amplitudes exhibit essentially the same amount are always available for the required formation of the quotient.

The inventive method advantageously unites most of the advantages of the minus-plus division with those of the AC/DC division.

The signals inventively that are derived from the intensities of the light components generated by the light sent through the field or of the two intensity signals are preferably and advantageously formed with the assistance of a correction factor selected such that the signal intensity parts fluctuating periodically anti-phase relative to one another of the signal acquired by multiplication with this correction factor and of the other derived signal exhibit an amplitude of essentially the same amount. It thereby suffices when the intensity of only of the light components generated by the light sent through the field or of the intensity signals that can be freely selected is multiplied by a correction factor but the intensity of the other light component or, respectively, intensity signal is not. Of the two acquired signals in this case, one represents the intensity of a light component or intensity signal multiplied by the correction factor and the other represents the unmodified intensity of the other light component or intensity signal. It could also be said that the correction factor of the other derived signal is equal to one.

Under certain circumstances, both acquired signals can respectively represent the intensity of the light component or, respectively, intensity signal allocated to it multiplied by a respective correction factor, so that each derived signal has arisen by multiplication with a respective correction factor differing from one.

A preferred and advantageous method for determining a correction factor is by formation of a quotient of the other intensity signal and the same amplitude-related, amount-oriented quantity of the one intensity signal to be multiplied by the correction factor.

A periodically fluctuating intensity part of an intensity signal required in this method can be acquired, for example, from a difference between the intensity of this intensity signal and a constant intensity part contained in this intensity signal the fundamental assumption that the periodically fluctuating intensity part of the intensity signal is composed essentially only of fluctuations cause only by the periodically fluctuating field strength on which essentially no noise fluctuations are superimposed, i.e. noise fluctuations that lie under a prescribable, allowable dimension with reference to the fluctuations caused by the field strength.

However, considerable noise fluctuations can often occur that, for example, lie on the same order of magnitude as the fluctuations caused by the field strength and can have different causes.

For example, such considerable noise fluctuations can occur occasionally or regularly due to mechanical vibrations at the sensor and/or the optical channels carrying the intensity signals occurring for the greatest variety of reasons.

Such considerable noise fluctuations on both intensity signals can—dependent on the cause—be more or less equiphase or in anti-phase relative to one another and exhibit amplitudes of the same or of a different amount.

When the noise fluctuations exhibit a relatively small amount at all frequencies at which the fluctuations caused by field strength have a relatively large amount, the noise fluctuations—regardless of type—can be largely neutralized by filtering out all noise fluctuations lying at different frequencies with amplitudes of a relatively great amount, particularly when the amplitudes having a relatively small amount of the frequency components of the noise fluctuations lie below the prescribable allowable dimension.

A simple band-pass filtering with a band-pass filter often suffices.

Especially beneficial conditions are present when the fluctuations caused by field strength lie essentially at a single frequency, as is the case, for example, given periodically fluctuating field strength caused by alternating current or alternating voltage of a fixed frequency of, for example, 50 Hz or 60 Hz. It is rare here that noise fluctuations exhibit a frequency component with an amplitude of an adequately great amount exactly at this fixed frequency; on the contrary, this amount will usually be adequately small. A very narrow-band filter that essentially allows only the fixed frequency to pass but blocks at all other frequencies is then adequate for neutralizing the noise fluctuations.

Accordingly, the procedure in that a periodically fluctuating intensity part is acquired by filtering the intensity signal containing this intensity part has the considerable advantage that the inventive method can also be successfully applied given considerable noise fluctuations.

In the determination of the correction factor by formation of a quotient of the other intensity signal and the same amplitude-related, amount-oriented quantity of the one intensity signal to be multiplied by the correction factor, for example, the amount of an amplitude of the periodically fluctuating intensity part of an intensity signal or an effective value of this intensity part as well can be utilized as a specific amplitude-related quantity. It is more expedient, however, to employ a chronological average of the amounts of a plurality of amplitudes of the respective periodically fluctuating intensity part as the specific amplitude-related quantity, since the identified correction factor in this case is more independent of predetermined and/or arbitrary amplitude fluctuations. In any case, a division of zero by zero is avoided in the required formation of the quotient with the quantities determined in one of the ways described above.

An alternative embodiment of the method is characterized in that the intensity of one of the two intensity signals is multiplied by an adjustable, preliminary correction factor; an aggregate intensity is formed by summation of the intensity of the one intensity signal multiplied by the preliminary correction factor and the intensity of the other intensity signal not multiplied by a correction factor; a constant intensity part contained in the aggregate intensity is identified; a difference intensity is formed from the aggregate intensity and the constant intensity part contained therein; and the preliminary correction factor is set such to a final correction factor that the difference intensity is essentially equal to zero. The inventive method can be realized to an analog and/or digital components.

An arrangement for the implementation of the inventive method provides an acquisition means for acquiring two signals from the two intensity signals that comprise signal intensity parts periodically fluctuating anti-phase relative to one another corresponding to the intensity parts of the intensity signals such that the signal intensity parts of both acquired signals comprise amplitudes of essentially the same amount; and the sum of the intensities of the two acquired signals is essentially constant; and a means for forming a quotient from a difference of the two acquired signals and their sum. Preferred and advantageous embodiments of the arrangement provide that the acquisition means comprises a multiplication means for multiplying at least one of the two intensity signals by a correction factor selected such that the signal parts periodically fluctuating in anti-phase relative to one another of the derived signal acquired by multiplication of this one intensity signal by this correction factor and of the other derived signal exhibit amplitudes of essentially the same amount. A correction factor determination means for determining the correction factor by which an intensity signal is to be multiplied is preferably provided. The correction factor determination means has a means for acquiring the periodically fluctuating intensity part from the intensity signal that is to be multiplied by the correction factor; a means for deriving the periodically fluctuating intensity part from the other intensity signal; and a means for forming a quotient representing this coefficient from a specific, amplitude-related, amount-oriented quantity of the periodically fluctuating intensity part acquired from the other intensity signal and the same amplitude-related, amount-oriented quantity of the periodically fluctuating intensity part acquired from the one intensity signal.

A means for acquiring the periodically fluctuating intensity part from an intensity signal comprises a difference forming means for forming a difference between the intensity of this intensity signal and a constant intensity part of this intensity signal. The means for deriving the periodically fluctuating intensity part from an intensity signal comprises a filter means for filtering the periodically fluctuating intensity part from its intensity signal. The means for generating the specific, amplitude-related, amount-oriented quantity is in the form of a chronological average of the amount of the respective, acquired, periodically fluctuating intensity part. The acquisition means comprises a means for multiplying the intensity of one of the two intensity signals by an adjustable, preliminary correction factor; a means for forming an aggregate intensity by summation of the intensity of the one intensity signal multiplied by the preliminary correction factor and the intensity of the other intensity signal not multiplied by a correction factor; a means for determining a constant intensity part contained in the aggregate intensity; a means for forming a difference intensity from the aggregate intensity and the constant intensity part contained therein; and a means for setting the preliminary correction factor to a final correction factor such that the difference intensity is essentially equal to zero through 15.

Given the inventive method and the inventive arrangement, no information about the polarization condition of the constant light component of an optical signal supplied to a polarization beam splitter is lost.

BRIEF DESCRIPTION OF THE DRAWINGS

The invention is explained in greater detail in the following description with reference to the Figures.

FIG. 7 is a block diagram of an alternative embodiment of a derivation means contained in the arrangement according to claim 1.

DETAILED DESCRIPTION OF THE PREFERRED EMBODIMENTS

Figure 1:
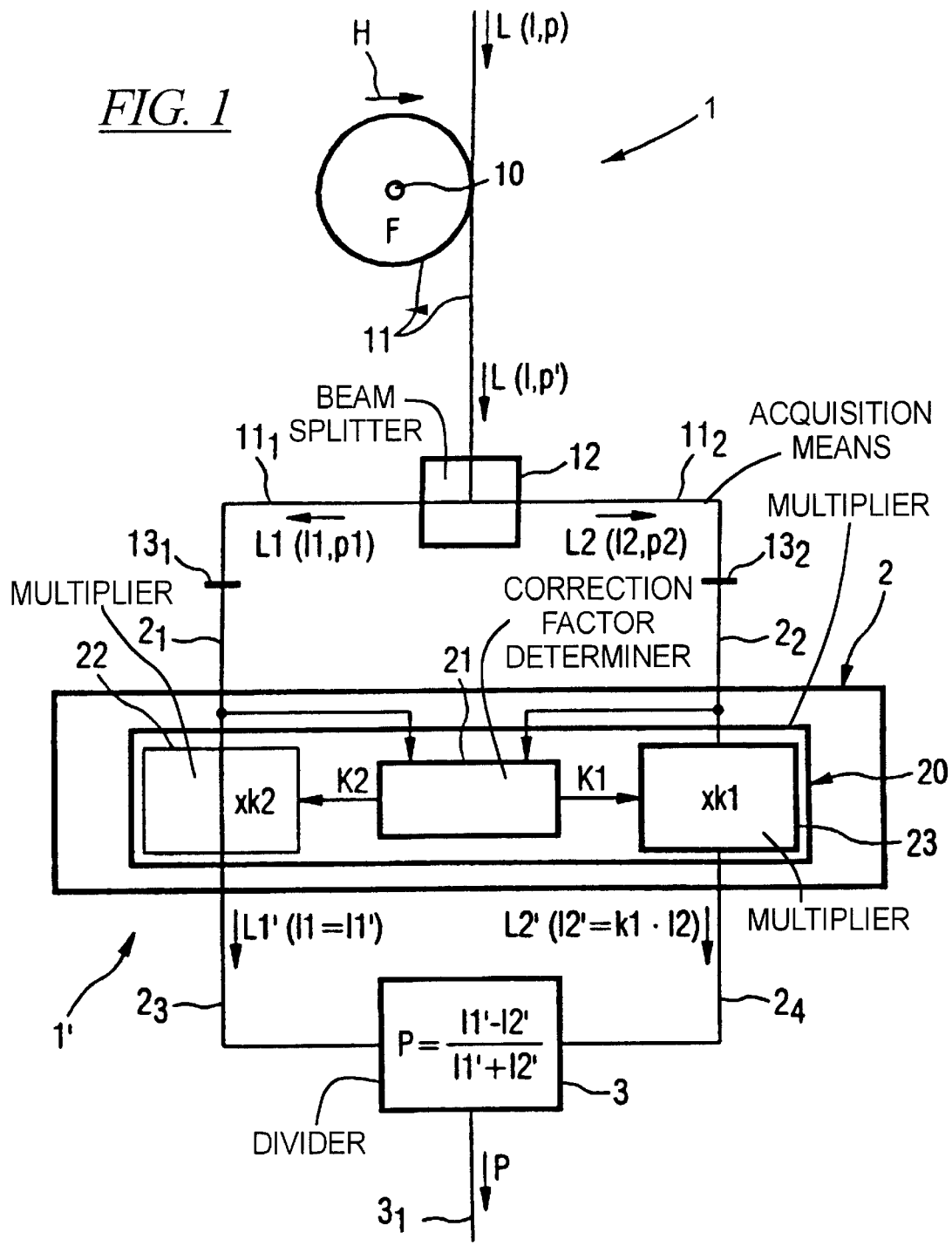
FIG. 1 is a schematic illustration of an exemplary optical sensor for measuring a periodically fluctuating magnetic field strength together with an exemplary arrangement for the implementation of the inventive method shown in the fashion of a block circuit diagram.

In FIG. 1, the exemplary optical sensor for measuring a periodically fluctuating electrical and/or magnetic field strength is referenced 1 and the exemplary arrangement for the inventive intensity norming of this sensor is referenced 1'.

Specifically and without limiting the universality of the invention, the exemplary sensor 1 is a two-channel polarmetric alternating current sensor that comprises an optical conductor 11 surrounding an electrical conductor 10 that carries the alternative current and proceeds, for example, perpendicular to the plane of the drawing, optical conductor 11 carrying polarized light L of a specific intensity I and a specific polarization condition p upon preservation of this polarization condition p.

For example, the optical conductor 11 can be composed of a fiber coil surrounding the conductor 10.

The optical conductor 11 surrounding the electrical conductor 10 lies in the region of the magnetic field generated by the alternating current and surrounding the conductor 10 whose magnetic field strength $\vec{H}$ which is constantly changing in direction is directed parallel to the plane of the drawing and perpendicular to the conductor 10.

The light L having the specific intensity I and the specific polarization condition p is coupled into the optical conductor 11. The light L that is coupled in experiences a modification of the polarization condition p when passing through the magnetic alternating field surrounding the electrical conductor 10 due to specific physical effects, for example the Faraday effect, such that a polarization condition p' which is periodically fluctuating symmetrically around a specific, fixed polarization condition $p_0'$ corresponding to the alternating current arises.

The light L of this fluctuating polarization condition p' is supplied in the optical conductor 11 to a polarization beam splitter 12 that divides this light L into two polarized light components L1 and L2 each having a fixed polarization condition p1 or, respectively p2, that differs from one another, whereby the polarization beam splitter 12 is set relative to the fixed polarity condition $p_0'$ of the light L supplied to it such that the intensities I1 and I2 of the two generated light components L1 and L2—in conformity with the periodically fluctuating polarization condition p' of the supplied light L—exhibit intensities I1 and I2 that are periodically fluctuating in anti-phase relative to one another, i.e. the intensity I1 of the light component L1 is composed of a constant intensity part I1DC on which a periodically fluctuating intensity part I1AC is superimposed and the intensity I2 of the light part L2 is composed of a constant intensity part I2DC on which a periodically fluctuating intensity part I2AC is superimposed, whereby the two periodically fluctuating intensity parts I1AC and I2AC are in anti-phase relative to one another.

In the ideal, noise-free case, the amount |A1| of the amplitude A1 of the periodically fluctuating intensity part I1AC referred to the constant intensity part I1DC of the intensity I1 of the one light component L1 is essentially equal to the amount |A2| of the amplitude A2 of the periodically fluctuating intensity part I2AC referred to the constant intensity I2DC of the intensity I2 of the other light component L1, i.e. essentially |A1|=|A2|=|A| essentially applies.

The intensities of the intensity signals I1 and I2 of the two generated light components L1 and L2—apart from attenuation losses in the splitter 12—supplement one another to, in other words, add up to the intensity I of the supplied light L. When this intensity I is constant, the sum I1+I2 of the intensities I1 and I2 of the two light components L1 and L2 is also constant.

The light component L1 is supplied either directly or through an optical conductor $ll_1$ to an opto-electrical transducer location $13_1$ in which the light component signal L1 is converted from the optical into the electrical form. Likewise, the light component L2 is supplied directly or through an optical conductor $11_2$ to an opto-electrical transducer location $13_2$ in which this component signal L2 is brought from the optical into the electrical form.

The electrical component signal L1 is supplied to an acquisition means 2 of the inventive arrangement for intensity norming in an electrical conductor $2_1$ and the electrical intensity signal L2 is supplied thereto in an electrical conductor $2_2$.

When the two optical conductors $11_1$ and $11_2$ exhibit different attenuations relative to one another, the periodically fluctuating intensity parts I1AC or, respectively, I2AC of the component signals L1 and L2 have amplitudes A1 or, respectively, A2 of an amount |A1|≠|A2| differing from one another. The effect thereof is that the sum I1+I2 of the intensities I1 and I2 of these two component signals L1 and L2 is also not constant but periodically fluctuates in time corresponding to the alternating current.

Figure 2:
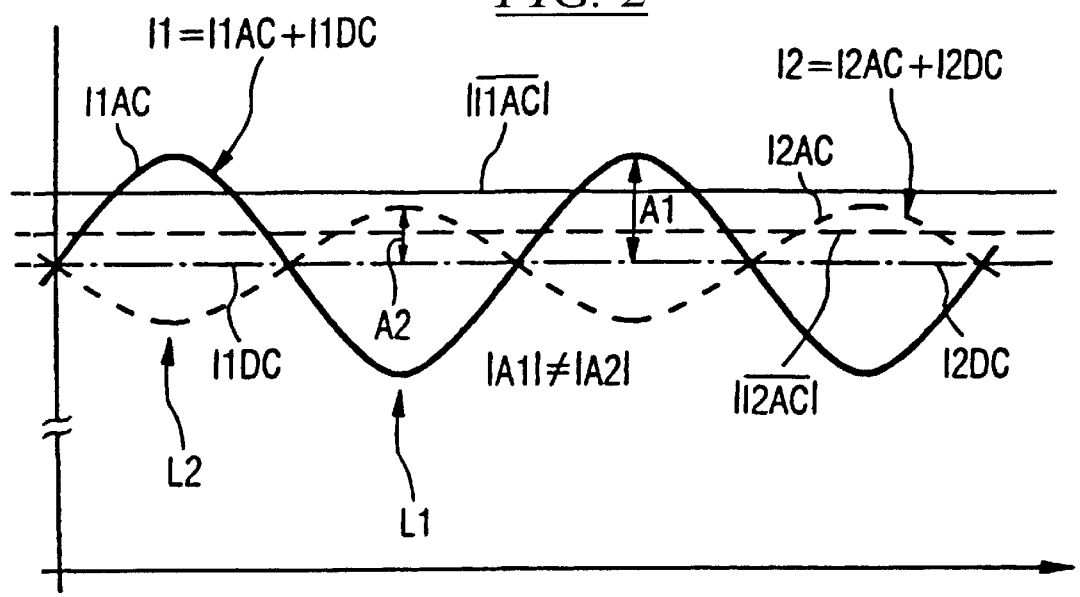
FIG. 2 is a graph of exemplary intensity signals with intensity components fluctuating periodically anti-phase relative to one another shown on the time axis.

Let this be made clear by way of example on the basis of FIG. 2, given the assumption that the attenuation of the optical conductor $11_2$ is higher than that of the optical conductor $11_1$. In FIG. 2, the component signal L1 carried in the optical conductor $11_1$ is shown with a solid line and the intensity signal L2 conducted in the optical conductor $11_2$ is shown with a broken line. The intensity I1 of the intensity signal L1 is composed of the constant intensity part I1DC and of the intensity I1AC periodically fluctuating with reference to the level of this part I1DC and having the amplitude A1 with the amount |A1|. The intensity I2 of the intensity signal L2 is composed of the constant intensity part I2DC and the intensity I2AC periodically fluctuating with reference to the level of this part I2DC and having the amplitude A2 with the amount |A2|. Due to the higher attenuation in the optical conductor $11_2$ compared to the optical conductor $11_1$, the amount |A1| of the amplitude A1 of the periodically fluctuating intensity part I1AC with the intensity I1 of the intensity signal L1 conducted in the optical conductor $11_1$ is greater than the amount |A2| of the amplitude A2 of the periodically fluctuating intensity part I2AC with the intensity I2 of the intensity signal L2 conducted in the optical conductor $11_2$.

For the sake of simplicity, the level of the constant intensity part I2DC of the intensity I2 of the intensity signal L2 conducted in the optical optical [sic] conductor $11_2$ in FIG. 2 is selected equal to the level of the constant intensity part I1DC of the intensity I1 of the intensity signal L1 conducted in the optical conductor $11_1$. Due to the relatively higher attenuation in the optical conductor $11_2$, the level of the constant intensity part I2DC is likewise lower in reality then the level of the constant intensity part I1DC. It is not the constant intensity parts I1DC and I2DC but only the periodically fluctuating intensity parts I1AC and I2AC that are responsible for the periodic fluctuation of the sum I1+I2.

The level of the constant intensity parts I1DC and I2DC of the intensities I1 and I2 of the component signals L1 and L2 are shown constant over time in FIG. 2. This is only the case when the intensity I of the light L supplied to the polarization beam splitter 12 is constant. When this intensity I fluctuates, then the constant intensity parts I1DC and I2DC of the intensities I1 and I2 of the component signals L1 and L2 also fluctuate.

Inventively, two signals L1' and L2' having signal intensities I1' or, respectively, I2' corresponding to the intensities I1 or, respectively, I2 of the two component signals L1 and L2 are acquired from the two component signals L1 and L2 in the acquisition means 2, whereby the signal intensities I1' or, respectively, I2' contain signal intensity parts I1'AC or, respectively, I2'AC fluctuating periodically in anti-phase relative to one another corresponding to the periodically fluctuating intensity parts I1AC or, respectively, I2AC of the intensity I1 or, respectively, I2 of the component signals L1 or, respectively, L2 such that the periodically fluctuating signal intensity parts I1'AC or, respectively, I2'AC of both acquired signals L1' and L2' exhibit amplitudes A of essentially the same amount |A|, and the sum I1'+I2' of the signal intensities I1' and I2' of both acquired signals L1' and L2' is essentially constant.

Figure 3:
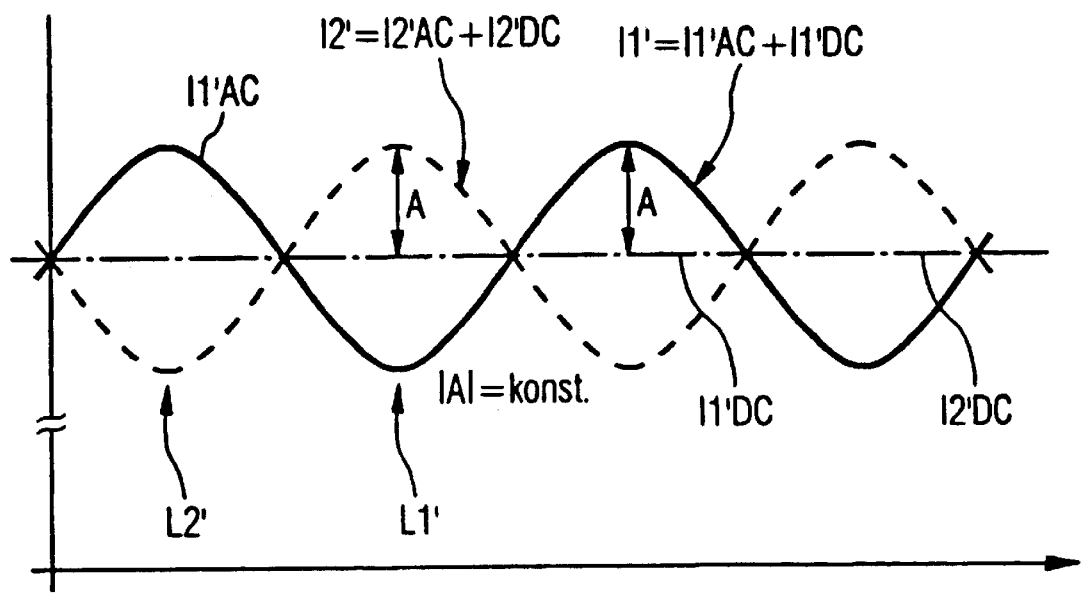
FIG. 3 signals derived from the intensity signals of FIG. 2 that exhibit signal intensities periodically fluctuating anti-phase relative to one another with amplitudes having essentially the same amount.

FIG. 3 shows the signals L1' and L2' acquired in this way, whereby the acquired signal L1' is shown with a solid line and the acquired signal L2' is shown with a broken line. The signal intensity I1' of the acquired signal L1' is composed of the signal constant intensity part I1'DC and the signal intensity part I1'AC that is fluctuating periodically with reference to the level of this part I1'DC and having the amplitude A of the amount |A|. The signal intensity I2 of the acquired signal L2' is composed of the signal constant intensity part I2'DC and the signal intensity part I2'AC that is periodically fluctuating with reference to the level of this part I2'DC and having the amplitude A of the same amount |A|. For the sake of simplicity, the level of the signal constant intensity part I1'DC of the acquired signal L1' in FIG. 3 is likewise selected to be equal to the level of the signal constant intensity part I2'DC of the acquired signal I2'. This, however, is not required.

Via, for example, electrical lines $2_3$ or $2_4$, the two acquired signals L1' and L2' are supplied to a means 3 for forming a quotient, in which, for example, the quotient P=(I1'−I2')/(I1'+I2') composed of the difference I1'−I2' between these two intensities I1'I2' and the sum I1'+I2' of these intensities I1' and I2' is formed from the intensities I1' and I2' of the two acquired signals L1' and L2' and is output for further-processing, for example at an electrical line $3_1$.

The acquisition means 2 can modify both the component signal L1 as well as the component signal L2; however, both of these together are not required. The acquisition means 2 can be fashioned such that only one of the two component signals is modified relative to the other.

It is assumed by way of example given the example of FIG. 1 that the acquisition means 2 leaves the intensity I1 of the component signal L1 unmodified, so that this signal L1 is the acquired signal at the same time, i.e. L1=L1' applies; but the intensity I2 of the intensity signal L2 is modified by contrast into the other I2' intensity of the acquired signal L2' for amplitude matching, so that I2≠I2' applies. It could also be converse, i.e. such that the component signal L2 remains unmodified, i.e. L2=L2' applies, and the component signal L1 is converted into the acquired signal L1' which is different therefrom.

The exemplary acquisition means 2 according to FIG. 1 comprises a multiplication means 20 for multiplying the intensity I2 of the intensity signal L2 by a correction factor k1≠1 that is selected such that the periodically fluctuating intensity part I2AC'=k1·I2AC of the intensity k1·I2=I2' multiplied with this correction factor k1 of the acquired signal L2' thereby formed and the periodically fluctuating intensity part I1'AC of the intensity I1 left unmodified of the intensity signal L1 forming the acquired signal at the same time respectively exhibit the amplitude A of the same amount |A|.

Instead of the multiplication means 20 or in addition thereto, a multiplication means 22 (indicated with broken lines) could also be provided for multiplying the intensity signal I1 with a correction factor k2≠1 selected such that the periodically fluctuating intensity part I1'AC=k2·I1AC of the intensity I1'=k2·I1 multiplied with this correction factor k2 of the acquired signal L1' thereby formed and the periodically fluctuating intensity part I2'AC of the intensity I2 left unmodified of the component signal L2 forming the acquire signal at the same time respectively exhibit the amplitude A having the same amount |A|.

A correction factor determination means 21 is provided for determining the correction k1 and/or k2 with which the appertaining intensity signal I2 or, respectively, I1 is to be multiplied.

Figure 4:
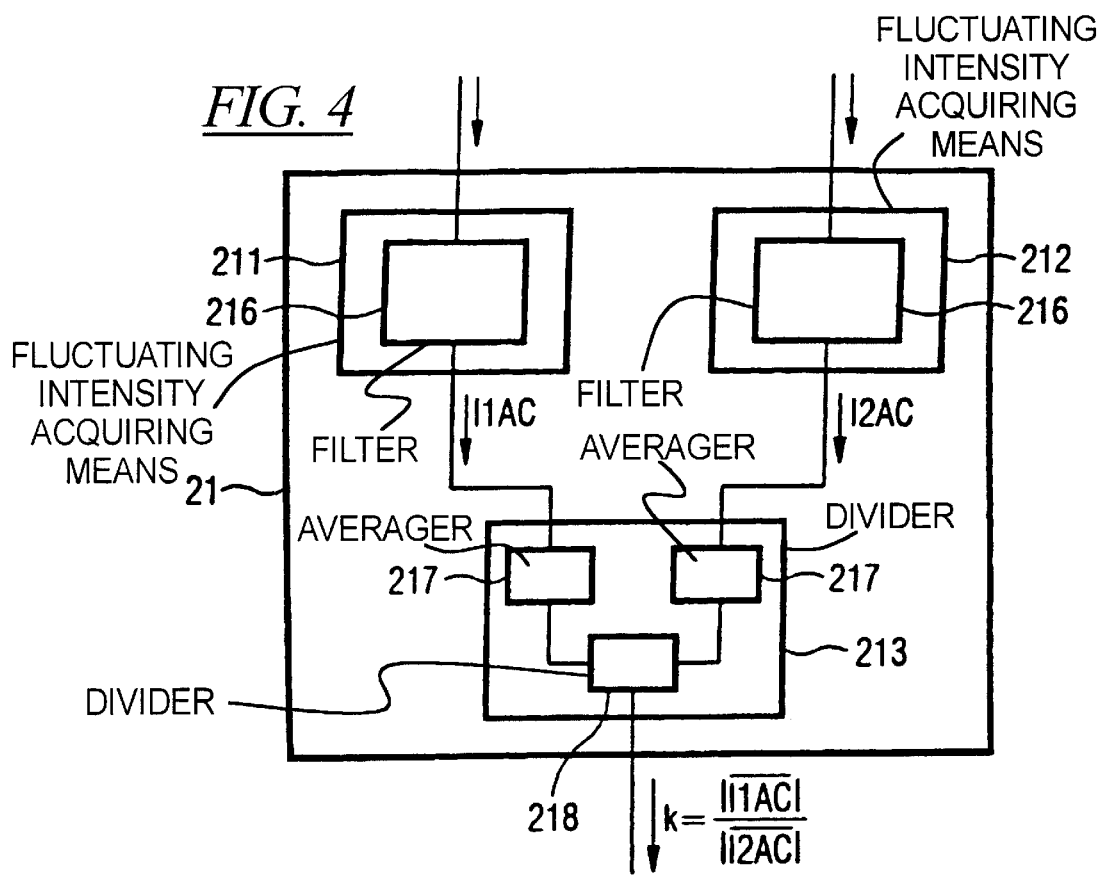
FIG. 4 is a block circuit diagram of an exemplary correction factor determination means of the arrangement according to FIG. 1.

An example of such a correction factor determination means is shown in FIG. 4. This exemplary means 21 serves for determining the correction factor k1 and comprises a means 212 for acquiring the periodically fluctuating intensity part I2AC from the component signal L2 to be multiplied by this correction factor k1, a means 211 for acquiring the periodically fluctuating intensity part I1AC from the other component signal L1, and a means 213 for forming a specific quotient $|\overline{I1AC}|/|\overline{I2AC}|$ representing this coefficient k1 from a specific, amplitude-related, amount-oriented quantity $|\overline{I1AC}|$ of the periodically fluctuating intensity part I1AC acquired from the other intensity signal L1 and the same amplitude-related amount-oriented quantity $|\overline{I2AC}|$ of the periodically fluctuating intensity part I2AC acquired from the component signal L2.

For forming the correction factor k2, the means 213 would have to be fashioned such that the quotient $|\overline{I2AC}|/|\overline{I1AC}|$ is formed.

Each of the means 211 and 212 for acquiring the periodically fluctuating intensity part I1AC or, respectively, I2AC from the intensity signal L1 or, respectively, L2 advantageously comprises a filter means 216 for filtering the periodically fluctuating intensity part I1AC or, respectively, I2AC from its component signal L1 or, respectively, L2. In the present case wherein the periodically fluctuating intensity parts I1AC and I2AC lie at only a fixed frequency, the alternating current frequency of, for example 50 Hz or 60 Hz, this filter means 216 is composed of a narrow-band filter that only allows this one frequency to pass but blocks all other frequencies. As a result thereof, all noise fluctuations that do not exhibit an amplitude of an adequately great amount at this fixed frequency can be neutralized.

Figure 5:
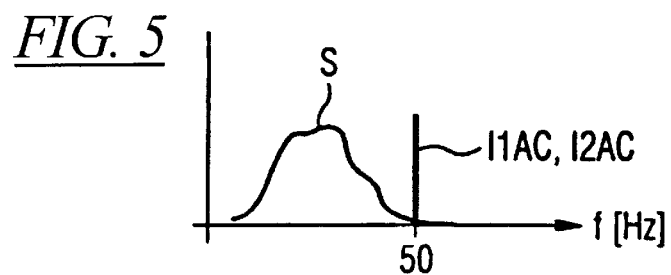
FIG. 5 is a graph of an exemplary frequency spectrum with frequency components of the fluctuations caused by field strength and of noise fluctuation.

In a diagram, FIG. 5 shows an example of such a frequency spectrum. In this diagram, the amount of the amplitude of the component signals L1 and L2 as well as that of noise fluctuations dependent on the frequency f entered on the abscissa is entered on the ordinate. The frequency of the periodically fluctuating intensity parts I1AC or, respectively, I2AC of the intensity signals L1 and L2 respectively lies at 50 Hz; the frequency spectrum of the noise fluctuations superimposed on the component signals L1 and L2 and caused, for example by mechanical vibrations is referenced S.

Figure 6:
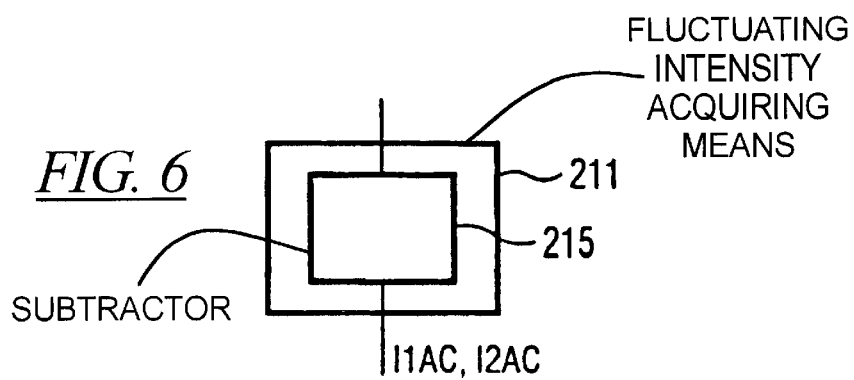
FIG. 6 is a block diagram of an alternative part of the correction factor determination means according to FIG. 4.

A means 211 or, respectively, 212 for acquiring the periodically fluctuating intensity part I1AC or, respectively, I2AC from the appertaining component signals L1 or, respectively, L2 can also comprise a difference-forming means 215 (indicated in FIG. 6) for forming a difference I1-I1DC or, respectively, I2-I2DC between the intensity I1 or, rspectively, I2 of this intensity signal L1 or, respectively, L2 and the constant intensity part I1DC or, respectively, I2DC of this component signal L1 or, respectively, L2. This difference I1-I1DC or, respectively, I2-I2DC forms the periodically fluctuating intensity part I1AC or, respectively, I2AC of the appertaining component signal L1 or, respectively, L2.

The amplitude-related, amount-oriented quantity is preferably a chronological average $|\overline{I1AC}|$ or, respectively, $|\overline{I2AC}|$ of the amount |I1AC| or, respectively, |I2AC|) [sic] of the respective, acquired, periodically fluctuating intensity part I1AC or, respectively I2AC of the appertaining intensity signal L1 or, respectively, L2. In this case, a means 217 is provided for generating the specific, amplitude-related, amount-oriented quantity in the form of the chronological average $|\overline{I1AC}|$ or, respectively, $|\overline{I2AC}|$ of the amount |I1AC|, |I2AC| of the respective, acquired, periodically fluctuating intensity part I1AC or, respectively, I2AC.

In an alternative embodiment of an inventive means, the acquisition means 2 comprises a means 221 for multiplying the intensity I2 or, respectively, I1 of one L2 or, respectively, L2 of the two intensity signals L1 and L2 with a variable, preliminary correction factor k1' or k2';

a means 222 for forming an aggregate intensity k1'·I2+I1 or, respectively, k2'·I1+I2 by summation of the intensity k1'·I2 or, respectively, k2'·I1 of the one component signal L2 or, respectively, L1 multiplied by the preliminary correction factor k1' or, respectively, k2' and the intensity I1 or, respectively, I2 of the other component signal L1 or, respectively, L2 that has been left unmodified;

a means 223 for determining a constant intensity part $(k1'·I2+I1)_{DC}$ or, respectively, $(k2'·I1+I2)_{DC}$ containing in the aggregate intensity k1'·I2+I1 or, respectively, k2'·I1+I2;

a means 224 for forming a difference intensity $(k1' \cdot I2+I1)-(k1' \cdot I2+I1)_{DC}$ or, respectively, $(k2' \cdot I1+I2)-(k1' \cdot I2+I1)_{DC}$ from the aggregate intensity $k1' \cdot I2+I1$ or, respectively, $k2' \cdot I1+I2$ and the constant intensity part thereof $(k1' \cdot I2+I1)_{DC}$ or, respectively $(k2' \cdot I1+I2)_{DC}$; and a means 225 for setting the preliminary correction factor k1' or, respectively, k2' to a final correction factor k1 or, respectively, k2 such that the difference intensity $(k1' \cdot I2+I1)-(k1' \cdot I2+I1)_{DC}$ or, respectively, $(k12' \cdot I1+I2)-(k1' \cdot I2+I1)_{DC}$ is essentially equal to zero.

The means 225 is preferably a regulating means.

The invention is not limited to the alternating current sensor 1 described by way of example but can be generally applied given any sensor, particularly given alternating voltage sensors as well.

Although other modifications and changes may be suggested by those skilled in the art, it is the intention of the inventor to embody within the patent warranted hereon all changes and modifications as reasonably and properly come within the scope of their contribution to the art.

What is claimed is:

1. A method for intensity norming of an optical sensor for measuring an electrical and/or magnetic field with a periodically fluctuating field strength, comprising the steps of:

sending light through the field;

generating from said light two component signals separated from one another comprising intensities containing intensity parts fluctuating periodically in anti-phase relative to one another dependent on the periodically fluctuating field strength and, for intensity norming, from the two component signals, acquiring two signals with signal intensities corresponding to intensities of the two intensity signals, the signal intensities contain signal intensity parts periodically fluctuating in anti-phase relative to one another corresponding to periodically fluctuating intensity parts of the intensities of the component signals such that the periodically fluctuating signal intensity parts of both acquired intensity signals exhibit amplitudes of different amounts; and a sum of the signal intensities of the two acquired component signals is essentially constant; and determining a quantity by quotients from a difference of the signal intensities of the two acquired intensity signals and a sum of said signal intensities.

2. A method according to claim 1, further comprising the steps of:

forming the two acquired component signals including mulitplying at least one of the two component signals with a correction factor selected such that the signal intensity parts fluctuating periodically in anti-phase relative to one another of the signal acquired by multiplication with this correction factor and of the other derived component signal exhibit an amplitude of essentially a same amount.

3. A method according to claim 2, further comprising the steps of:

determining the correction factor by which the component signal is to be multiplied by formation of a quotient from a specific, amplitude-related, amount-oriented quantity of the other component signal and the same amplitude-related, amount-oriented quantity of the periodically fluctuating intensity part of the one component signal to be multiplied by the correction factor.

4. A method according to claim 3, further comprising the step of:

acquiring a periodically fluctuating intensity part of the component signal from a difference between the intensity of the component intensity signal and a constant intensity part contained in the component signal.

5. A method according to claim 3, further comprising the step of acquiring a periodically fluctuating intensity part by filtering the component signal containing this intensity part.

6. A method according to claim 3, further comprising the step of:

employing a chronological average of the amount of the intensity part as a defined, amplitude-related, amount-oriented quantity of a periodically fluctuating intensity part.

7. A method according to claim 2, further comprising the steps of:

multiplying the intensity of one of the two component signals by an adjustable preliminary correction factor;

forming an aggregate intensity by summation of the intensity of one of said component signals multiplied by the preliminary correction factor and the intensity of the other component signal not multiplied by a correction factor;

identifying a constant intensity part contained in the aggregate intensity;

forming a difference intensity from the aggregate intensity and the constant intensity part contained therein; and adjusting the adjustable preliminary correction factor to a final correction factor such that the difference intensity is essentially equal to zero.

8. An arrangement for intensity norming of an optical sensor for measuring an electrical and/or magnetic field with a periodically fluctuating field strength, comprising:

an acquisition means for acquiring two signals from two component signals that comprise signal intensity parts periodically fluctuating in anti-phase relative to one another corresponding to the signal intensity parts of the component signals such that the signal intensity parts of both acquired component signals comprise amplitudes of different amounts; and a sum of intensities of the two acquired component signals is essentially constant; and a means for forming a quotient from a difference of the two acquired component signals and their sum.

9. An arrangement according to claim 8, wherein the acquisition means includes a multiplication means for multiplying at least one of the two component signals by a correction factor selected such that the signal intensity parts periodically fluctuating in anti-phase relative to one another of the derived signal acquired by multiplication of one of said component signals by this correction factor and of another of said component signals exhibit amplitudes of essentially a same amount.

10. An arrangement according to claim 9, further comprising:

a correction factor determination means for determining the correction factor by which said component signal is to be multiplied.

11. An arrangement according to claim 10, wherein the correction factor determination means includes a means for acquiring a periodically fluctuating intensity part from the component signal that is to be multiplied by the correction factor;

a means for deriving the periodically fluctuating intensity part from the other component signal; and a means for forming a quotient representing said correction factor from a specific, amplitude-related, amount-oriented quantity of the periodically fluctuating intensity part acquired from the other component signal and the same amplitude-related, amount-oriented quantity of the periodically fluctuating intensity part acquired from the one component signal.

12. An arrangement according to claim 11, wherein said means for acquiring the periodically fluctuating intensity part from said component signal includes a difference forming means for forming a difference between the intensity of said component signal and a constant intensity part of said component signal.

13. An arrangement according to claim 11, wherein said means for deriving the periodically fluctuating intensity part from an intensity signal includes a filter means for filtering the periodically fluctuating intensity part from its component signal.

14. An arrangement according to claim 10, further comprising:

a means for generating specific, amplitude-related, amount-oriented quantity in the form of a chronological average of an amount of a respective, acquired, periodically fluctuating intensity part.

15. An arrangement according to claim 8, wherein the acquisition means includes a means for multiplying the intensity of one of the two intensity signals by an adjustable preliminary correction factor;

a means for forming an aggregate intensity by summation of the intensity of the one component signal multiplied by the preliminary correction factor and the intensity of the other component not multiplied by a correction factor;

a means for determining a constant intensity part contained in the aggregate intensity;

a means for forming a difference intensity from the aggregate intensity and the constant intensity part contained therein; and a means for adjusting the adjustable preliminary correction factor to a final correction factor such that the difference intensity is essentially equal to zero.

16. A method for intensity norming of an optical sensor for measuring at least one of an electrical field and a magnetic field with a periodic fluctuation field strength, comprising the steps of:

sending light through the field;

separating two intensity signals from one another, generating from the light transmitted through the field intensities being contained in intensity parts which fluctuate periodically in anti-phase relative to one another depending on a periodically fluctuating field strength and exhibiting amplitudes of different amounts; for intensity norming, acquiring two signals from the intensity signals with signal intensities corresponding to the intensities of the two intensity signals, the signal intensities of the two acquired signals contain signal intensity parts that periodically fluctuate in an anti-phase relative to one another corresponding to the periodically fluctuating intensity parts of the intensities of the intensity signals so that the periodically fluctuating intensity parts of both acquired signals exhibit amplitudes of essentially the same amount, and a sum of the signal intensities of the two acquired signals is essentially constant, and determining a quantity by a quotient from a difference of the signal intensities of the two acquired intensity signals and the sum of the signal intensities.

* * * * *